United States Patent [19]

Matsumoto et al.

[11] Patent Number: 4,815,088
[45] Date of Patent: Mar. 21, 1989

[54] SEMICONDUCTOR LASER ARRAY DEVICE

[75] Inventors: Mitsuhiro Matsumoto; Sadayoshi Matsui, both of Tenri; Mototaka Taneya, Ibaraki, all of Japan

[73] Assignee: Sharp Kabushiki Kaisha, Osaka, Japan

[21] Appl. No.: 105,638

[22] Filed: Oct. 5, 1987

[30] Foreign Application Priority Data

Oct. 7, 1986 [JP] Japan .................................. 61-238237

[51] Int. Cl.$^4$ .............................................. H01S 3/19
[52] U.S. Cl. ......................................... 372/46; 372/50
[58] Field of Search .............................. 372/43, 46, 50

[56] References Cited

U.S. PATENT DOCUMENTS 4,255,717 3/1981 Scifres et al. ......................... 372/50

FOREIGN PATENT DOCUMENTS 0130184 7/1985 Japan ...................................... 372/50

Primary Examiner—William L. Sikes
Assistant Examiner—B. Randolph
Attorney, Agent, or Firm—Ciotti & Murashige, Irell & Manella

[57] ABSTRACT

A semiconductor laser array device with a waveguide structure comprising waveguides designed such that the widths thereof gradually increase from the center waveguide to the waveguides positioned at both sides of the array portions.

3 Claims, 2 Drawing Sheets

SEMICONDUCTOR LASER ARRAY DEVICE

BACKGROUND OF THE INVENTION

1. Field of the invention

This invention relates to a semiconductor laser array device in which a plurality of semiconductor lasers are disposed in a parallel manner with an optical phase coupling between the adjacent semiconductor lasers.

2. Description of the prior art

Semiconductor laser devices having a single semiconductor lasing filament structure can only produce 80 mW laser beams at their best. In order to produce high optical output power, semiconductor laser array devices, in which a plurality of semiconductor lasers are disposed in a parallel manner on a single substrate to achieve an optical phase coupling between the adjacent semiconductor lasers, have been studied. In the case where the individual semiconductor lasers have the same gain, the semiconductor laser array devices tend to oscillate laser beams with a 180° phase-shift therebetween rather than with a 0° phase-shift therebetween. This is because the optical intensity distribution is in accord with the gain distribution in the 180° phase-shift mode rather than in the 0° phase-shift mode, resulting in a high oscillation gain.

The radiation pattern, i.e., the far-field pattern, of laser beams with a 0° phase-shift therebetween exhibits a single peak so that the laser beams can be concentrated into a single spot by means of optical lenses, whereas the far-field pattern of laser beams with a 180° phase-shift therebetween exhibits dual peaks so that the laser beams cannot be concentrated into a single spot by any optical lens. These semiconductor laser array devices, producing laser beams which cannot be concentrated into a single spot, are inconvenient for optical coupling with other optical systems, and cannot be used as light sources for optical discs, etc. Thus, semiconductor laser array devices producing laser beams with a 0° phase-shift therebetween are required.

A semiconductor laser array device which selectively oscillates laser beams with a 0° phase-shift therebetween has been proposed by Japanese Patent Application No. 60-67448, wherein a waveguide structure with symmetrically branching waveguides is employed. A semiconductor laser array device has been also proposed by M. Taneya, M. Matsumoto, et al., Appl. Phys. Lett., 47(4), 1985, wherein selective oscillation in a 0° phase-mode is experimentally observed.

FIG. 4 shows the waveguide structure of each of the above-mentioned semiconductor laser array devices, wherein a plurality (an odd number) of waveguides 31 are disposed in a parallel manner with a certain pitch and a plurality (an even number) of waveguides 32 are disposed, opposite the said parallel waveguides 31, in a parallel manner with a certain pitch. These parallel waveguides 31 and 32 are optically connected to each other by symmetrically branching waveguides 30. When laser beams with a 0° phase-shift therebetween are propagated from the parallel waveguides 31 (or 32) to the parallel waveguides 32 (or 31) through the symmetrically branching waveguides 30, they undergo no optical loss due to the optical interference therebetween. However, when laser beams with a 180° phase-shift therebetween are propagated from the parallel waveguides 31 or 32 to the parallel waveguides 32 or 31 through the symmetrically branching waveguides 30, they experience loss, to a great extent, due to the optical interference therebetween, so that the semiconductor laser array devices with such a symmetrically branching waveguide structure can attain selective oscillation. The optical intensity distributions in the 0° phase-mode at the light-emitting faces of the array devices are, as shown in FIG. 4, the distributions 33 and 34 indicating that the optical intensity within each of the parallel waveguides 31 and 32 exhibits a sine curve, the peak of which decreases from the center of the waveguides to both ends. Since the optical intensity becomes maximum in the center waveguide as mentioned above, the center waveguide of the conventional semiconductor laser array devices tends to deteriorate.

SUMMARY OF THE INVENTION

The semiconductor laser array device with a waveguide structure of this invention, which overcomes the above-discussed and numerous other disadvantages and deficiencies of the prior art, comprises a first array portion which is composed of n waveguides that are disposed in a parallel manner with an optical phase-coupling between the adjacent waveguides with a certain pitch, said waveguides being designed such that the widths thereof gradually increase from the center waveguide to the waveguides positioned at both sides of the first array portion (wherein n is an odd number greater than 2), a second array portion which is composed of (n−1) waveguides that are disposed opposite the waveguides of the first array portion and in a parallel manner with an optical phase-coupling between the adjacent waveguides with a certain pitch, said waveguides being designed such that the widths thereof gradually increase from the center waveguides to the waveguides positioned at both sides of the second array portion, and a third array portion which is composed of a plurality of symmetrically branching waveguides that optically connect the tapered portions of the waveguides of the first array portion with the tapered portions of the waveguides of the second array portion. The effective refractivities of the individual waveguides of the first and second array portions increase with an increase in the widths of said waveguides.

The waveguide structure is, in a preferred embodiment, of a ridged type.

Thus, the invention described herein makes possible the objects of (1) providing a semiconductor laser array device having a plurality of waveguides with an optical phase-coupling therebetween which attains an optical intensity distribution exhibiting uniform optical intensities with regard to the individual waveguides at the light-emitting face; and (2) providing a semiconductor laser array device having a plurality of waveguides with an optical phase-coupling therebetween which attains a 0° phase-shift between the adjacent waveguides, resulting in stabilized laser oscillation in a single mode.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
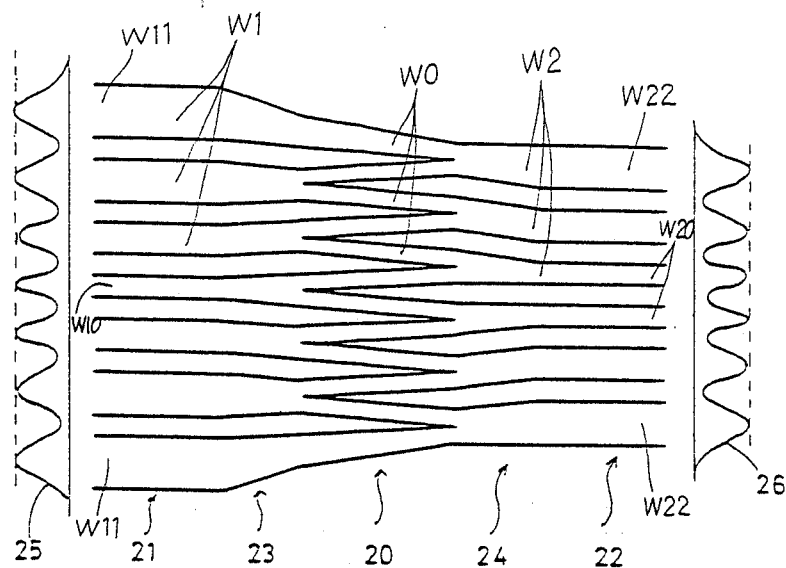
FIG. 1 is a diagram showing the waveguide structure of a semiconductor laser array device of this invention.

FIG. 1 shows the waveguide structure of a semiconductor laser array device of this invention, which comprises a first array portion 21 having a plurality (n; an odd number greater than 2, i.e., n≧3) of waveguides W1 that are disposed in a parallel manner with an optical phase-coupling therebetween with a certain pitch, a second array portion 22 having a plurality (n−1) of waveguides W2 that are disposed opposite the said waveguides W1 in a parallel manner with an optical phase-coupling therebetween with a certain pitch, and a third array portion 20 having a plurality of symmetrically branching waveguides W0 that optically connect the parallel waveguides W1 with the parallel waveguides W2. The widths of the waveguides W1 gradually increase from the center waveguide W10 to the waveguides W11 positioned at both sides at the first array portion 21. The widths of the waveguides W2 gradually increase from the center waveguides W20 to the waveguides W2 at both sides of the second array portion 22. Each of the waveguides W1 and each of the waveguides W2 are tapered in the vicinity of the areas 23 and 24 in which these waveguides W1 and W2 are connected to the branching waveguides W0.

Since the semiconductor laser array device has the above-mentioned waveguide structure, the effective refractivities of the individual waveguides of the first and second array portions 21 and 22 increase with an increase in the widths of the waveguides. Since the widths of the waveguides of the first and second array portions 21 and 22 gradually increase from the center waveguide(s) to the waveguides positioned at both sides of each of the array portions 21 and 22, the effective refractivities of the individual waveguides gradually increase from the center waveguide(s) to the waveguides positioned at both sides of each of the array portions 21 and 22. Moreover, since laser beams of a 0° phase-mode tend to concentrate within waveguides having high refractivities, when the width of each of the parallel waveguides of the first and second array portions 21 and 22 is selected to be a certain level, the semiconductor laser array device can attain oscillation in a 0° phase-mode with the optical intensity distributions 25 and 26, as shown in FIG. 1, indicating that the peak of the optical intensity within one waveguide is equal to that of the optical intensity within another waveguide. Moreover, this semiconductor laser array device attains selective oscillation in a 0° phase-mode for the same reasons as those in the conventional symmetrically branching waveguide array device. This is because when laser beams with a 0° phase-shift therebetween are propagated through the branching waveguides W0, they do not undergo optical loss, while laser beams with a 180° phase-shift therebetween undergo loss.

Figure 2:
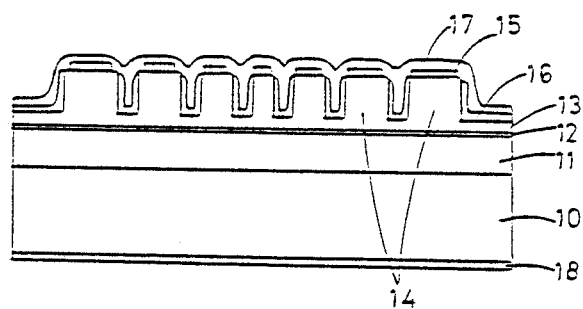
FIG. 2 is a front sectional view of the semiconductor laser array device shown in FIG. 1.

This semiconductor laser array device is manufactured as follows: As shown in FIG. 2, on a p-GaAs substrate 10, a p-$Al_yGa_{1-y}As$ first cladding layer 11, an n- or p-$Al_xGa_{1-x}As$ active layer 12 and an n-$Al_yGa_{1-y}As$ second cladding layer 13 are successively grown by a crystal growth technique such as liquid phase epitaxy, metal-organic chemical vapor deposition or molecular beam epitaxy (wherein x<y). On the second cladding layer 13, a photoresist is formed by plasma assisted chemical vapor deposition, followed by a photolithographic treatment and a reactive ion beam etching treatment to form a waveguide pattern 14 (wherein array portions 20, 21, 22, 23 and 24 are formed by ridges). On each ridge, the n-sided electrode 15 is then formed. An insulating oxidation film 16 is formed on the second cladding layer 13 except for the ridged portions. Then, the entire surface of the grown layer including the electrode 15 and the oxidation film 16 is covered by the n-sided electrode 17. The p-sided electrode 18 is formed on the bottom face of the p-GaAs substrate 10, followed by cleaving to form laser mirrors at both facets at right angles to the ridged waveguide-pattern 14, resulting in an array device unit having an internal cavity length of 200–300 μm. The facets are then coated with an $Al_2O_3$ thin film having a thickness of half of the laser light wavelength. The array device unit is then mounted on a copper block (not shown) by a soldering material in such a manner that the n-sided electrode 17 comes into contact with the copper block, resulting in a semiconductor laser array device.

The oscillation threshold current of the semiconductor laser array device with a direct current voltage drive was 250 mA, and moreover the optical intensity distribution at each facet indicating that the peaks of the optical intensities of the individual waveguides are uniform was attained when the waveguide structure was designed under the following conditions:

The difference in the refractivity in the lateral direction between the inside of the ridges and the outside of the ridges of the ridged waveguide-pattern 14 is set to be $7 \times 10^{-3}$–$8 \times 10^{-3}$; the space between the adjacent parallel waveguides of the first array portion 21 is set to be 1 μm; the widths of the parallel waveguides of the first array portion 21 are set to be 4.9 μm, 4.6 μm, 4.3 μm, 4.0 μm, 4.3 μm, 4.6 μm, and 4.9 μm, respectively, from the waveguide W11 at one side to the waveguide W11 at the other side; the space between the adjacent parallel waveguides of the second array portion 22 is set to be 1 μm; and the widths of the parallel waveguides of the second array portion 22 are set to be 4.6 μm, 4.3 μm, 4.0 μm, 4.0 μm, 4.3 μm and 4.6 μm from the waveguide W22 at one side to the waveguide W22 at the other side.

Figure 3:
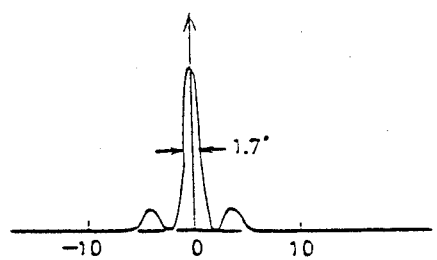
FIG. 3 is a diagram showing the far-field pattern attained by the semiconductor laser array device shown in FIG. 2.
Figure 4:
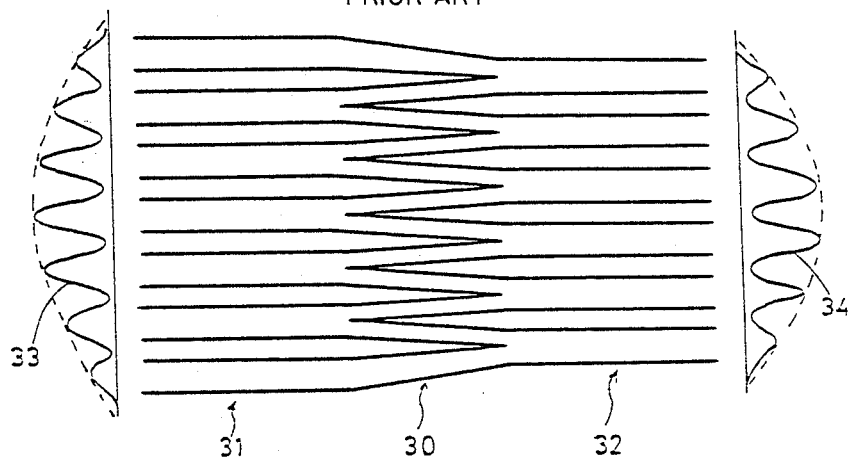
FIG. 4 is a diagram showing the waveguide structure of a conventional semiconductor laser array device.

The far-field pattern of the above-mentioned semiconductor laser array device exhibited a single peak that is close to a diffraction limit as shown in FIG. 3. Even when injection current was increased, kinks never arose in the current-optical output characteristics of this laser array device, which allowed for the achievement of stabilized oscillation. The destructive output level of the laser array device having seven parallel active waveguides was 250 mW, which is 1.5 times that of a conventional laser array device having waveguides with the uniform widths.

Although the above-mentioned example discloses only the GaAs-AlGaAs system, this invention is, of course, applicable to other semiconductor materials such as the InP-InGaAsP system, etc. Moreover, as the waveguide structure, structures other than the ridged type can be used.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser array device with a waveguide structure comprising:
   a first array portion which is composed of n waveguides that are disposed in a parallel manner with an optical phase-coupling between the adjacent waveguides with a certain pitch, said waveguides being designed such that the widths thereof gradually increase from the center waveguide to the waveguides positioned at both sides of the first array portion (wherein n is an odd number greater than 2),
   a second array portion which is composed of (n−1) waveguides that are disposed opposite the waveguides of the first array portion and in a parallel manner with an optical phase-coupling between the adjacent waveguides with a certain pitch, said waveguides being designed such that the widths thereof gradually increase from the center waveguides to the waveguides positioned at both sides of the second array portion, and
   a third array portion which is composed of a plurality of symmetrically branching waveguides that optically connect the tapered portions of the waveguides of the first array portion with the tapered portions of the waveguides of the second array portion.

2. A semiconductor laser array device according to claim 1, wherein the effective refractivities of the individual waveguides of the first and second array portions increase with an increase in the widths of said waveguides.

3. A semiconductor laser array device according to claim 1, wherein said waveguide structure is of a ridged type.

* * * * *